US011916101B2

(12) United States Patent
Claret et al.

(10) Patent No.: US 11,916,101 B2
(45) Date of Patent: Feb. 27, 2024

(54) CAPACITIVE DEVICE

(71) Applicant: COMMISSARIAT A L'ENERGIE ATOMIQUE ET AUX ENERGIES ALTERNATIVES, Paris (FR)

(72) Inventors: Thierry Claret, Grenoble (FR); Delphine Ferreira, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 387 days.

(21) Appl. No.: 17/171,028

(22) Filed: Feb. 9, 2021

(65) Prior Publication Data

US 2021/0257445 A1    Aug. 19, 2021

(30) Foreign Application Priority Data

Feb. 14, 2020 (FR) ...................... 20 01481

(51) Int. Cl.
| | |
|---|---|
| *H01L 49/02* | (2006.01) |
| *H01G 4/30* | (2006.01) |
| *H01G 4/33* | (2006.01) |
| *H01L 29/06* | (2006.01) |
| *B82Y 10/00* | (2011.01) |

(52) U.S. Cl.
CPC ............. *H01L 28/91* (2013.01); *H01G 4/30* (2013.01); *H01G 4/33* (2013.01); *H01L 29/0669* (2013.01); *B82Y 10/00* (2013.01)

(58) Field of Classification Search
CPC . H01L 29/0669; H01L 23/5223; H01L 28/91; H01L 28/90; H01G 4/30; H01G 4/33; H01G 4/08; H01G 4/005; B82Y 10/00; B82Y 40/00

USPC ........................................................ 438/253
See application file for complete search history.

(56) References Cited

U.S. PATENT DOCUMENTS

| | | |
|---|---|---|
| 9,349,789 B1 | 5/2016 | Vega |
| 10,370,759 B2 | 8/2019 | Okuno et al. |
| 2006/0214262 A1 | 9/2006 | Mosley et al. |
| 2008/0003768 A1 | 1/2008 | Oh |
| 2008/0197399 A1 | 8/2008 | Hsu et al. |
| 2010/0148221 A1* | 6/2010 | Yu .......................... B82Y 20/00 257/225 |

(Continued)

OTHER PUBLICATIONS

French Preliminary Search Report dated Oct. 27, 2020 in French Application 20 01 481 filed on Feb. 14, 2020 (with English Translation of Categories of Cited Documents), 2 pages.

(Continued)

*Primary Examiner* — Hrayr A Sayadian
(74) *Attorney, Agent, or Firm* — Oblon, McClelland, Maier & Neustadt, L.L.P.

(57) ABSTRACT

A capacitive device including a metallic layer; a network of nanotube or nanowire bundles that extend from a face of the metallic layer; a capacitive stack covering the metallic layer and the nanotube bundles in a conforming manner, the stack including an upper conducting layer and an insulating layer, the device including a capacitive zone and a lower contact zone, the capacitive zone being a zone wherein the upper conducting layer encapsulates the nanotube bundles and the insulating layer, while the lower contact zone is a zone wherein the capacitive stack leaves the free ends exposed, and the insulating layer encapsulates the upper conducting layer.

20 Claims, 12 Drawing Sheets

(56) References Cited

U.S. PATENT DOCUMENTS

2011/0100793 A1    5/2011   Ziaei et al.
2013/0250479 A1    9/2013   Manohara et al.

OTHER PUBLICATIONS

Saleem et al., "Fully solid-state integrated capacitors based on carbon nanofibers and dielectrics with specific capacitances higher than 200 $nF/mm^2$", 2019 IEEE $69^{th}$ Electronic Components and Technology Conference (ECTC), 2019, 7 pages.

Saleem et al., "Low temperature and cost-effective growth of vertically aligned carbon nanofibers using spin-coated polymer-stabilized palladium nanocatalysts" Science and Technology Advanced Materials, 16, 2015, 12 pages.

Kikuchi et al., Porous Aluminum Oxide Formed by Anodizing in Various Electrolyte Species, Hokkaido University Collection of Scholarly and Academic Papers: HUSCAP, 2015, 33 pages.

Dijon et al., "How to switch from a tip to base growth mechanism in carbon nanotube growth by catalytic chemical vapour deposition", Carbon, 48, 2010, pp. 3953-3963.

Liatard et al., "Vertically-aligned carbon nanotubes on aluminum as a light-weight positive electrode for lithium-polysulfide batteries", Chem. Commun., 51, 2015, pp. 7749-7752.

Ramos et al., Nanocarbon Interconnects Combining Vertical CNT Interconnects and Horizontal Graphene Lines, 2016 IEEE International Interconnect Technology Conference/Advanced Metallization conference (IITC/AMC), 2016, pp. 48-50.

U.S. Appl. No. 16/319,529, filed Jan. 22, 2019, Claret, T, et al.

\* cited by examiner

CAPACITIVE DEVICE

TECHNICAL FIELD

This invention relates to the field of nanostructures and methods of manufacturing them. In particular, this invention relates to the use of nanotubes, and particularly carbon nanotubes, in capacitive devices.

In this regard, this invention relates to a high density capacitive device that comprises a capacitive stack covering a nanotube network in a conforming manner. The configuration and/or the layout of the device disclosed in this invention makes this invention more compact than devices known in prior art. With the proposed configuration, the method of manufacturing the capacitive device is also simplified and makes it possible to maintain the integrity of nanotubes.

STATE OF PRIOR ART

Intense developments are currently being made on high density capacitors. These developments include in particular a stack called a capacitive stack composed of two or three layers, and formed on a surface or a structure with a high shape factor to limit the size of said capacitors.

In this regard, nanowires or nanotubes, and more particularly carbon nanotubes that have a high surface area/volume ratio, are ideal candidates for manufacturing these structures with a high shape factor. More particularly, in document [1] mentioned at the end of the description, the authors propose to form bundles of carbon nanotubes that extend perpendicular to a support surface and in a matrix configuration.

A set of technological steps can then be executed in order to obtain a capacitive device. These steps may for example comprise a step to form a capacitive stack using an Atomic Layer Deposition (ALD) technique on the network of nanotube bundles. Electrode formation and/or etching steps are also performed. However, the configuration or the arrangement of currently considered capacitive devices cannot preserve the integrity of nanotube bundles during execution of the manufacturing method.

Furthermore, the nanotube bundle manufacturing method as described in document [1], requires the following steps in particular:
- a0) the supply of a silicon substrate, a principal face of which is covered by a silicon dioxide layer, for example formed by a plasma enhanced vapour phase deposition;
- b0) the formation of a lower electrode, for example using a titanium and/or copper evaporation technique;
- c0) the formation of through openings in the lower electrode, said through openings being arranged in matrix form;
- d0) the formation of carbon nanotube bundles according to the conditions described in document [2] cited at the end of the description, each bundle initiating at a through opening.

However, this carbon nanotube bundle manufacturing method is not satisfactory.

Indeed, the formation of through openings requires the use of a hard mask.

Furthermore, to the extent to which it is required to form small openings at close spacing, these openings cannot be formed using standard photolithography techniques and the use of etching or electron beam lithography is thus necessary. However, the speed and the cost of this technique are not compatible with the requirements of the micro-electronics industry.

Thus, one purpose of this invention is to disclose a capacitive device that has an arrangement making it possible to envisage a manufacturing method protecting the integrity of nanotube bundles.

Another purpose of this invention is to disclose a capacitive device for which the manufacturing method is easier to implement than methods known in prior art.

PRESENTATION OF THE INVENTION

The purposes of this invention are at least partly achieved by a capacitive device comprising:
- a metallic layer provided with two principal faces, called the front face and the back face respectively;
- a network of nanotube or nanowire bundles that extend from the front face, and substantially perpendicular to the front face, from a base towards a free end;
- a continuous capacitive stack covering the metallic layer and the nanotube or nanowire bundles in a conforming manner from their base to their free end, said stack comprising an upper conducting layer and an insulating layer insulating the upper conducting layer from each nanotube bundle and from the metallic layer,
- the device comprising a capacitive zone and a lower contact zone,
- the capacitive zone being a zone in which the upper conducting layer encapsulates the nanotube or nanowire bundles and the insulating layer, while the lower contact zone is a zone in which firstly the capacitive stack leaves the free ends exposed, and secondly the insulating layer encapsulates the upper conducting layer.

According to one embodiment, said device comprises an upper electrode covering the capacitive zone so as to electrically contact the upper conducting layer.

According to one embodiment, said device comprises a lower electrode covering the lower contact zone so as to electrically contact the free ends of the nanotube or nanowire bundles in the lower contact zone.

According to one embodiment, the capacitive stack also comprises a lower conducting layer intercalated between the insulating layer and the nanotube or nanowire bundles, the lower conducting layer encapsulating the insulating layer in the lower contact zone.

According to one embodiment, the lower electrode is also in electrical contact with the lower conducting layer.

According to one embodiment, the lower conducting layer comprises titanium nitride.

According to one embodiment, the upper conducting layer comprises titanium nitride.

According to one embodiment, the insulating layer comprises alumina.

According to one embodiment, said device also comprises a neutral zone interposed between the capacitive zone and the lower contact zone, and in which a lower insulating layer is intercalated between the metallic layer and the nanotube or nanowire bundles in said neutral zone.

According to one embodiment, the neutral zone is covered with at least one encapsulation layer made of an insulating material.

According to one embodiment, the at least one encapsulation layer comprises a silicon oxide layer and a silicon nitride layer.

According to one embodiment, the length of the nanotube or nanowire bundles is between 2 μm and 40 μm, and preferably between 2 μm and 12 μm.

According to one embodiment, the metallic layer is supported through one of its faces opposite the front face, on a support substrate, advantageously a dielectric layer is intercalated between the support substrate and the metallic layer.

The invention also relates to a method of manufacturing the capacitive device according to this invention, said method comprising the following steps:

a) an anodisation step of a metallic layer with a first thickness E1, starting from a front face of said metallic layer and over a second thickness E2 less than the first thickness, and that will form an oxide layer;

b) a selective etching step of the oxide layer formed in step a);

d) a step of growth of a network of nanotube or nanowire bundles step a) being executed such that the exposed face of the metallic layer after step b) is textured, said texture being materialized by the presence of a network of concave cavities with average depth P and average lateral dimension D, said average depth P and said average lateral dimension D being adjusted such that each nanotube bundle initiates in a concave cavity and extends from said concave cavity from a base towards a free end substantially perpendicular to the metallic layer;

e) a definition step of the capacitive zone that comprises the formation of a stack of a first dielectric layer and a second dielectric layer covering the network of nanotube bundles, and the formation of a first through opening in said stack, the first opening delimiting the contact zone;

f) a formation step of a continuous capacitive stack covering the metallic layer and the nanotube or nanowire bundles from their base to their free end in a conforming manner, said stack comprising an upper conducting layer and an insulating layer insulating the upper conducting layer from each nanotube bundle and the metallic layer, the upper conducting layer encapsulating the nanotube or nanowire bundles and the insulating layer in the capacitive zone, while in a lower contact zone different from the capacitive zone, the capacitive stack leaves the free ends exposed, and the insulating layer encapsulates the upper conducting layer.

BRIEF DESCRIPTION OF THE DRAWINGS

Other characteristics and advantages will become clear in the following description of a capacitive device according to the invention, given as non-limitative examples, with reference to the appended drawings in which.

DETAILED PRESENTATION OF PARTICULAR EMBODIMENTS

This invention relates to a capacitive device provided with a capacitive stack deposited in a conforming manner to a network of nanotube bundles, and particularly carbon nanotube bundles. In this respect, the nanotube bundles extend from a front face of a metallic layer from a base towards a free end and substantially perpendicular to said front face.

The continuous capacitive stack comprises an upper conducting layer and an insulating layer insulating the upper conducting layer from each nanotube bundle and from the metallic layer.

The layout of the capacitive stack can define a capacitive zone and a lower contact zone within the capacitive device. In particular, the capacitive zone is a zone in which the upper conducting layer encapsulates the nanotube bundles and the insulating layer, while the lower contact zone is a zone in which firstly the capacitive stack leaves the free ends exposed, and secondly the insulating layer encapsulates the upper conducting layer.

Figure 1:
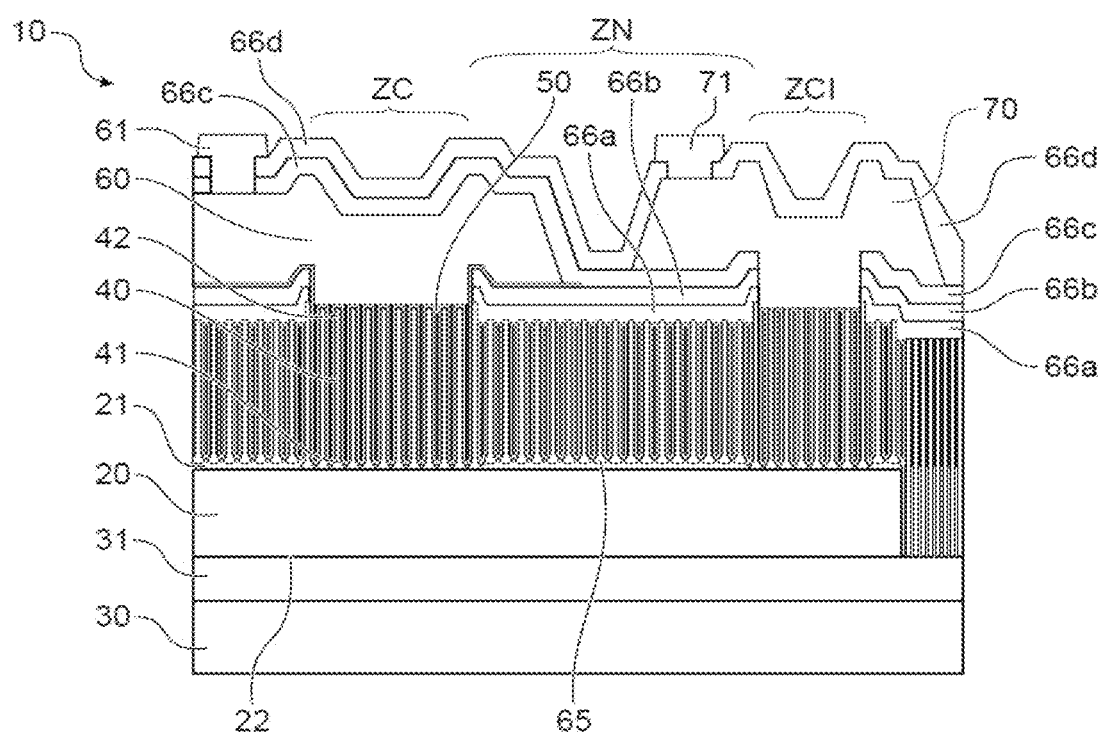
FIG. 1 is a diagrammatic representation of a capacitive device in a section plane perpendicular to a front face of the metallic layer according to this invention.

FIG. 1 shows an example of the capacitive device 10 according to this invention.

The capacitive device 10 is provided with a metallic layer 20 that comprises a front face 21 and an opposite back face 22 substantially parallel to the front face 21.

The metallic layer 20 may comprise aluminium or copper.

The metallic layer 20 can be between 0.5 μm and 3 μm thick.

According to one particular embodiment, the back face of the metallic layer 20 may be supported on a support substrate 30. A dielectric layer 31 may advantageously be intercalated between the support substrate 30 and the metallic layer 20.

The capacitive device according to this invention also comprises a network of nanotube bundles 40, the bundles extending from the front face 21 substantially perpendicular to this front face, from a base 41 to a free end 42. The term "network" means a dense arrangement of nanotube bundles, in particular at a spacing from each other equal to an average distance D of between 50 nm and 500 nm, advantageously between 50 nm and 300 nm, and particularly equal to 150 nm.

The term "nanotube bundle" means a set of nanotubes, substantially parallel to each other and possibly interwoven.

The description only mentions nanotube bundles, however the invention can also be implemented using nanowires, and more particularly nickel nanowires and silicon nanowires.

The nanotube bundles may comprise carbon nanotube bundles. However, the invention is not limited to this aspect, and an expert in the subject can consider any other species that could form nanotube bundles.

The length of the nanotube bundles can be between 2 μm and 40 μm, and preferably between 2 μm and 12 μm.

Each nanotube bundle can initiate in a concave cavity formed on the front face of the metallic layer. In this regard, the metallic layer 20 may be textured on its front face 21, said texture being materialized by the presence of a network of concave cavities with an average depth P and an average lateral dimension D, starting from which each nanotube bundle extends. Advantageously, the average lateral dimension D is between 50 nm and 500 nm, advantageously between 50 nm and 300 nm, and particularly equal to 150 nm. Also advantageously, the average depth P is between 10 nm and 20 nm.

Consideration of texturing in the form of concave cavities thus makes it possible to envisage a relatively dense network of nanotube bundles, and more particularly to obtain a bundle cross-sectional area to occupied surface area ratio of the order of 0.3. In particular, this density makes it possible to obtain an optimised configuration in terms of capacitors.

The capacitive device 10 according to this invention also comprises a capacitive stack 50. The capacitive stack 50 is continuous and covers the metallic layer 20 and the nanotube bundles 40 in a conforming manner from their bases 41 to their free ends 42.

In other words, the capacitive stack 50 at least partially fills the spaces between the nanotube bundles. More particularly, the capacitive stack 50 covers the metallic layer 20 (between the nanotube bundles) and the sides of the nanotube bundles. The capacitive stack 50 comprises an upper conducting layer 51 and an insulating layer 52 insulating the upper conducting layer from each nanotube bundle 40 and from the metallic layer 20.

The insulating layer 52 may comprise alumina ($Al_2O_3$).

The upper conducting layer 51 may comprise titanium nitride (TiN).

The device 10 comprises a capacitive zone ZC and a lower contact zone ZCI.

Figure 2:
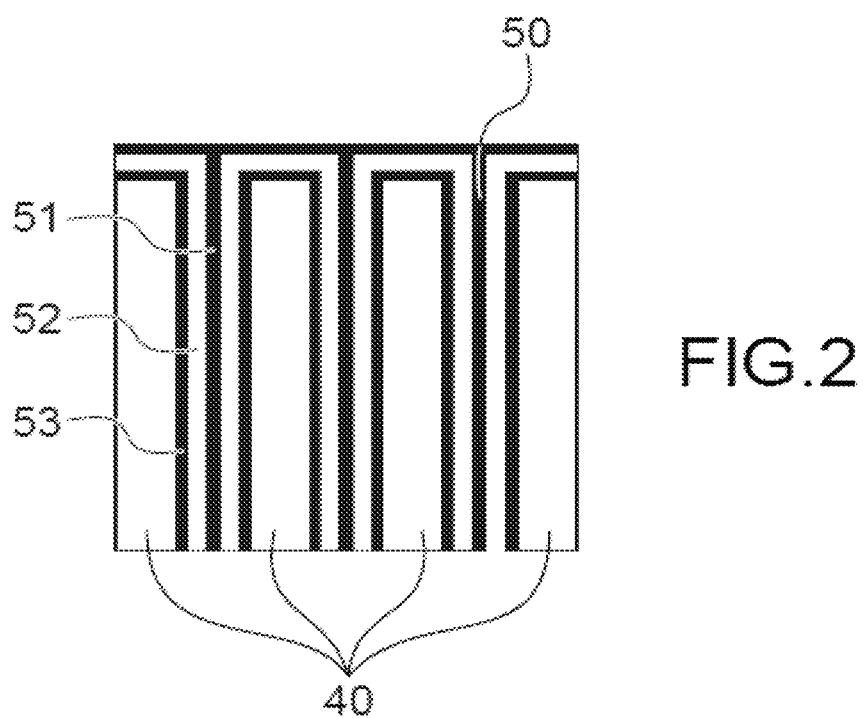
FIG. 2 is a diagrammatic representation illustrating details of the capacitive stack at the nanotube bundles.

The capacitive zone ZC is a zone in which the upper conducting layer 51 encapsulates the nanotube bundles 40 and the insulating layer 52. In other words, in this capacitive zone ZC, the free ends 42 of the nanotube bundles 40 are covered by the upper conducting layer 51 (it being understood that in this zone, the insulating layer 52 is intercalated between said bundles and the upper conducting layer 51). FIG. 2 illustrates the arrangement of layers of the capacitive stack 50 at the free ends of the nanotube bundles 40.

The capacitive device 10 may comprise an upper electrode 60 covering the capacitive zone ZC. The arrangement of the capacitive zone ZC thus makes it possible for the upper electrode 60 to make direct electrical contact with the upper conducting layer 51. The upper electrode 60 can be covered with one or several layers of insulating material 66c, 66d. Contact in the form of a metallic stud 61 ("Upper Bump Metallurgy"—UBM) can be formed through the layer 66c, 66d.

The lower contact zone ZCI is a zone in which firstly the capacitive stack 50 leaves the free ends 42 exposed, and secondly the insulating layer 52 encapsulates the upper conducting layer 51.

The capacitive device 10 may comprise a lower electrode 70 covering the lower contact zone ZCI so as to electrically contact the free ends 42 of the nanotube bundles 40 in said lower contact zone ZCI. Encapsulation of the upper conducting layer 51 by the insulating layer 52 makes it possible to electrically isolate the upper conducting layer 51 from the lower electrode 70.

The lower electrode 70 can be covered with the layer of insulating material 66d. Contact in the form of a metallic stud 71 ("Upper Bump Metallurgy"-"UBM") can be formed through the layer 66d.

According to one advantageous embodiment, the capacitive stack may comprise a lower conducting layer 53, for example made of titanium nitride, intercalated between the insulating layer and the nanotube bundles, the lower conducting layer encapsulating the insulating layer in the lower contact zone. Thus according to this variant, the lower electrode may also be in electrical contact with the lower conducting layer.

The capacitive device 10 may also comprise a neutral zone ZN interposed between the capacitive zone ZC and the lower contact zone ZCI. The neutral zone is characterised in particular by the presence of a lower insulating layer 65 intercalated between the metallic layer 20 and the nanotube bundles 40.

Once it is considered, the neutral zone ZN may be covered by at least one encapsulation layer 66a, 66b made of an insulating material. The at least one encapsulation layer may comprise in particular a silicon oxide layer 66a and a silicon nitride layer 66b covering the silicon oxide layer 66a.

The capacitive device 10 thus described has an arrangement such that the integrity of the nanotube bundles can be protected during the method of manufacturing said device. This method that also forms part of the invention, is described in the remainder of this presentation.

Thus, FIGS. 3 to 20 show an example of the method of manufacturing the capacitive device according to this invention.

Figure 3:
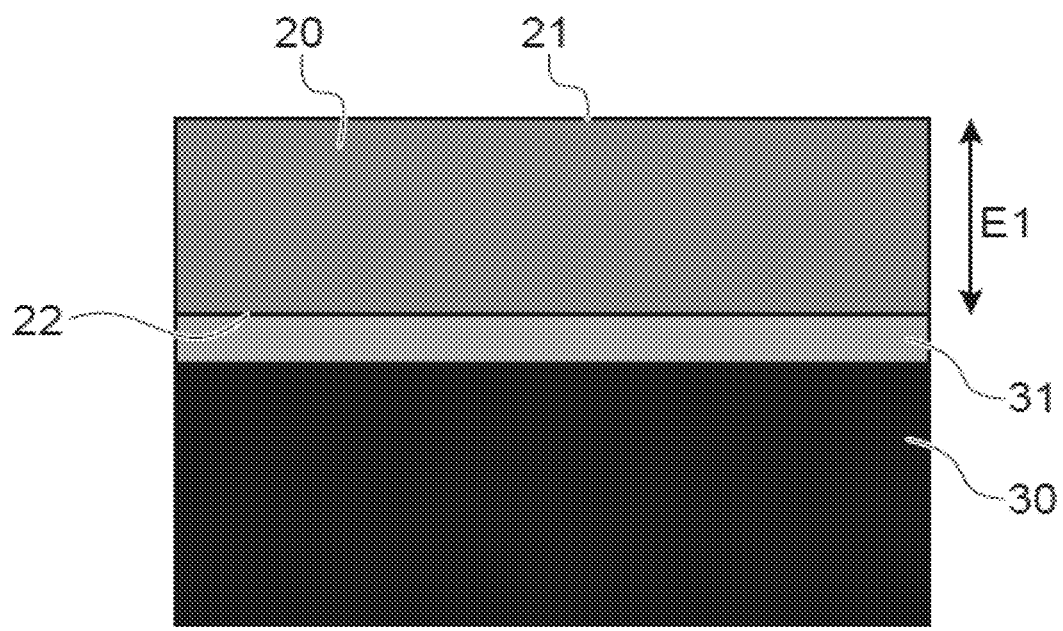
FIG. 3 is a diagrammatic representation of a metallic layer supported on a support substrate.

In particular, the method comprises the supply of a metallic layer 20 provided with a substantially parallel front face 21 and back face 22 (FIG. 3).

The metallic layer 20 may comprise a metal and particularly at least one element chosen among aluminium, copper.

The metallic layer 20 may have an initial thickness, called the first thickness E1, equal to more than 1.5 μm, and particularly between 1.5 μm and 4 μm, for example equal to 4 μm.

The metallic layer 20 may be supported through its back face 22 on a support substrate 30, and particularly a silicon substrate.

The metallic layer 20 may be formed using a deposition or evaporation technique.

A dielectric layer 31, for example a silicon oxide layer 31, can also be formed before deposition of the metallic layer 20. In other words, if it is considered, the dielectric layer 31 is intercalated between the metallic layer 20 and the support substrate 30.

Figure 4:
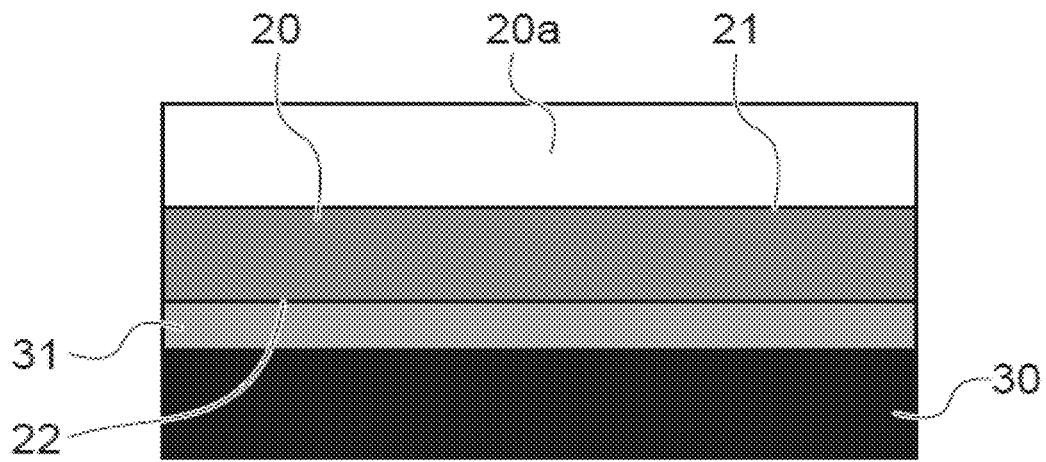
FIG. 4 is an illustration of an anodisation step of the metallic layer according to this invention.
Figure 5:
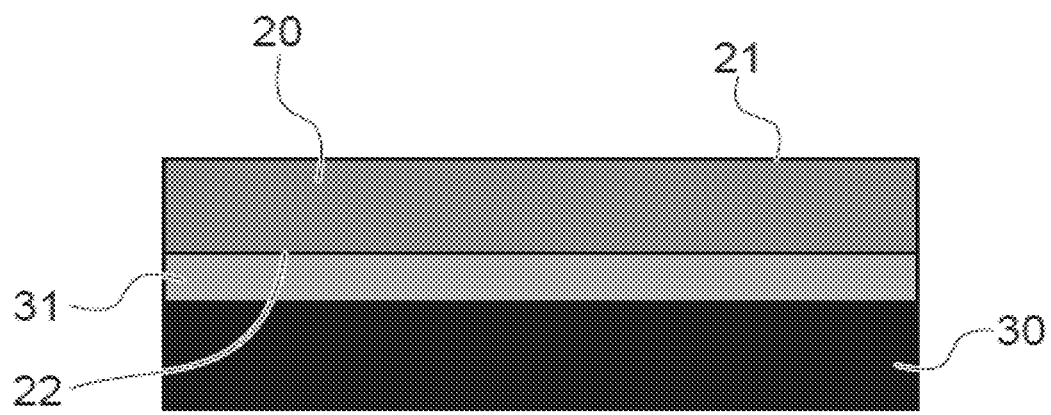
FIG. 5 is an illustration of an etching step of the oxide layer formed during the anodisation step according to this invention.
Figure 6:
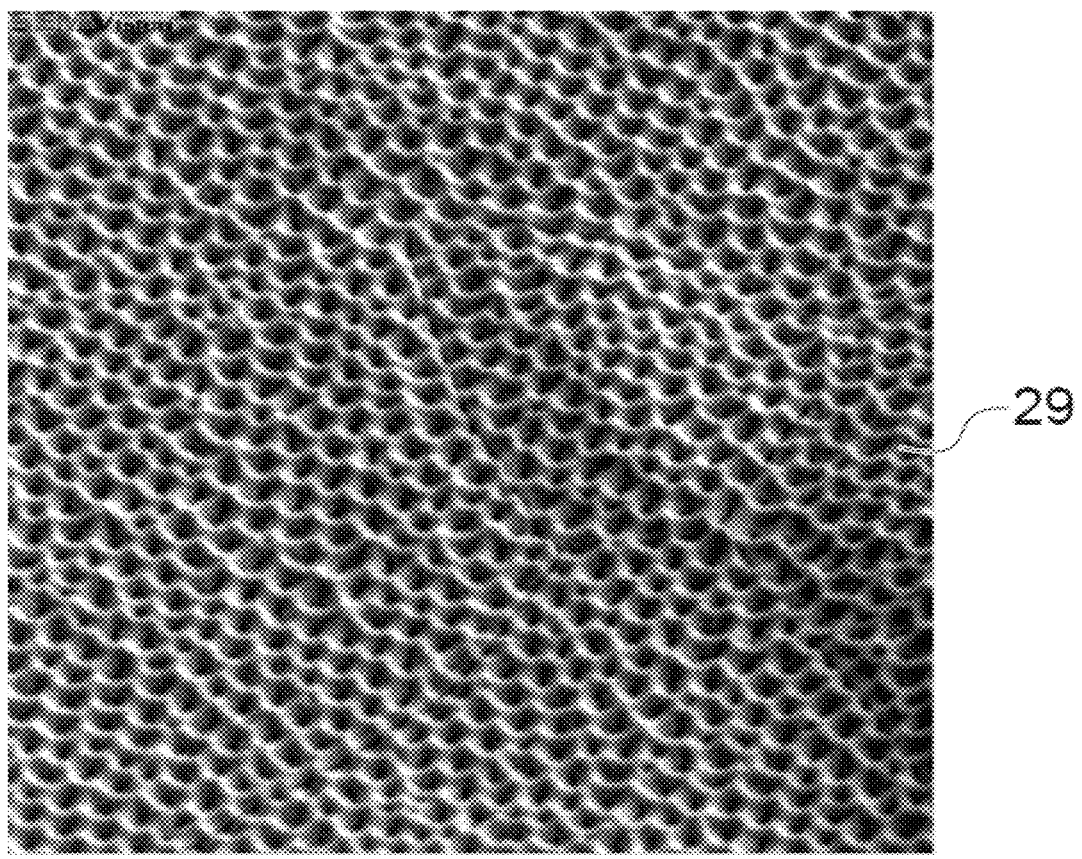
FIG. 6 is an image obtained by means of a scanning electron microscope using which a texture of the exposed face of the layer of conducting material can be observed after the etching step b) of the oxide layer according to this invention.

The method according to this invention comprises an anodisation step a) illustrated in FIG. 4 that will form an oxide layer 20a starting from the front face 21 of the metallic layer 20 by oxidisation of this metallic layer.

The anodisation step a) may be done in an acid bath, and particularly in a bath comprising at least one acid chosen from among selenic acid, sulphuric acid, oxalic acid and phosphatic acid. In this regard, the bath may be maintained at a temperature equal to between 2° C. and 3.5° C., for example equal to 3° C.

During this anodisation step a), the metallic layer 20 is consumed by oxidation starting from the front face 21 over a second thickness E2 less than the first thickness E1, and so as to form the oxide layer 20a. The second thickness E2 is advantageously between 0.5 μm and 3 μm, for example 1 μm.

Since the anodisation of a metal, and particularly of aluminium, is known to an expert in the subject and more particularly is presented in document [3] cited at the end of the description, this step is not described in detail in the remainder of this presentation.

The anodisation step a) is followed by a liquid etching step b), possibly with selective etching of the oxide layer 20a formed in step a).

"Selective etching" means an etching that preferentially etches the oxide layer 20a facing the metallic layer 20. In this regard, if the metallic layer 20 is made of aluminium, the oxide layer formed that comprises alumina may be selectively etched using phosphoric acid, or even buffered phosphoric acid.

An observation with the scanning electron microscope (FIG. 6) enabled the inventors to observe texturing of the exposed face of the metallic layer 20 at the end of step b). This texturing of the exposed face results particularly in the presence of dishes 29 or concave cavities 29.

"Dish" or "concave cavities" means hollows present on the exposed face, that have an average depth P and an average lateral dimension D.

The average lateral dimension D is in particular the dimension of the dish opening.

The adjustment of these two parameters P and D depends in particular on conditions imposed during the anodisation step a) and the nature of the metallic layer 20.

An expert in the subject will know how to adjust the anodisation conditions so as to obtain well-defined values of P and D, and therefore this will not be described in detail in this patent application.

Figure 21:
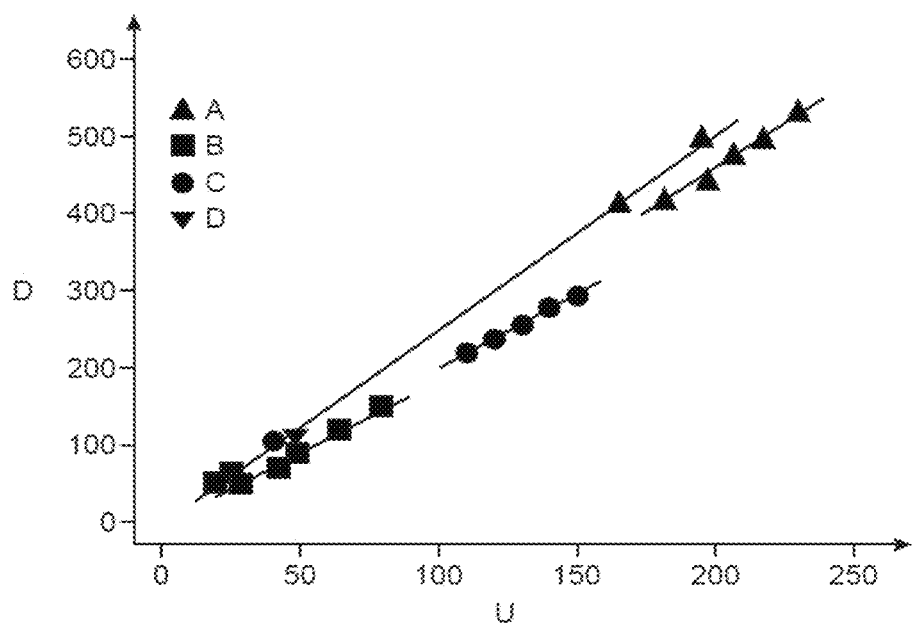
FIG. 21 is a graphic representation of the average lateral dimension of the dishes or cavities (vertical axis, in "nm") as a function of the potential U (horizontal axis, in "V") applied during the anodisation step of an aluminium layer, and in the presence of phosphoric acid (points "A"), or in the presence of sulphuric acid (points "B") or in the presence of oxalic acid (points "C") or in the presence of selenic acid (point "D").

In this regard, FIG. 21 is a graphic representation of the average lateral dimension D as a function of the anodisation potential U applied for different types of electrolyte. This graph very clearly shows that D can be equal to any value between 30 nm and 550 nm, depending on the imposed anodisation conditions.

Figure 7:
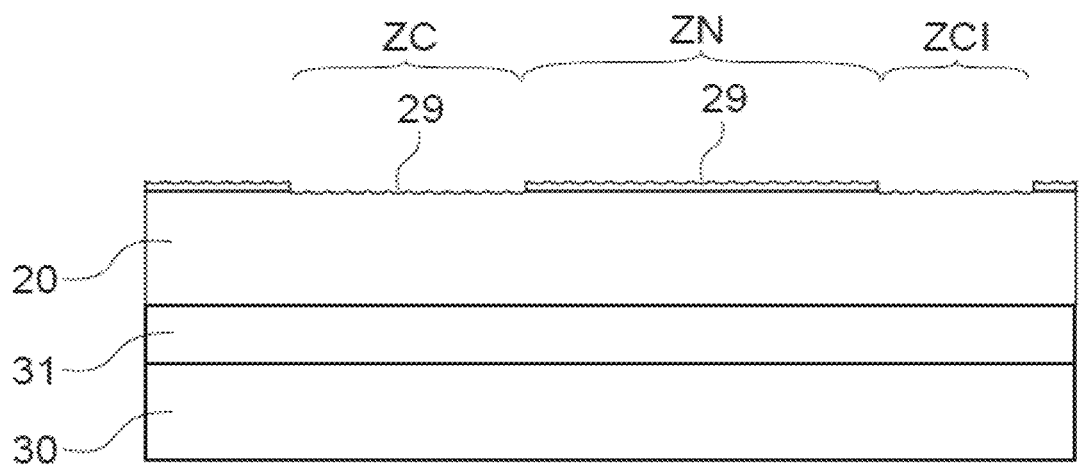
FIG. 7 is an illustration of a step to define capacitive, neutral and lower contact zones according to this invention.

The method according to this invention may also include a definition step c) of the capacitive zone ZC, the lower contact zone ZCI, and possibly the neutral zone ZN (FIG. 7).

In particular, step c) may include the following sub-steps:
  c1) a sub-step making a conforming deposition of a lower insulating layer
  c2) a photolithography/etching step intended to keep the lower insulating layer only in the neutral zone ZN.

In this regard, step c1) may include formation of the lower insulating layer, for example made of alumina, using an atomic layer deposition (ALD) technique or by anodisation of the aluminium layer. This technique makes it possible to make relatively conforming layers on the surface on which it is supported, and thus faithfully reproduce the texture imposed by the surface of the metallic layer 30, and particularly the arrangement of the concave cavities 29.

The lower insulating layer 65 may for example be between 10 nm and 100 nm thick.

Figure 8:
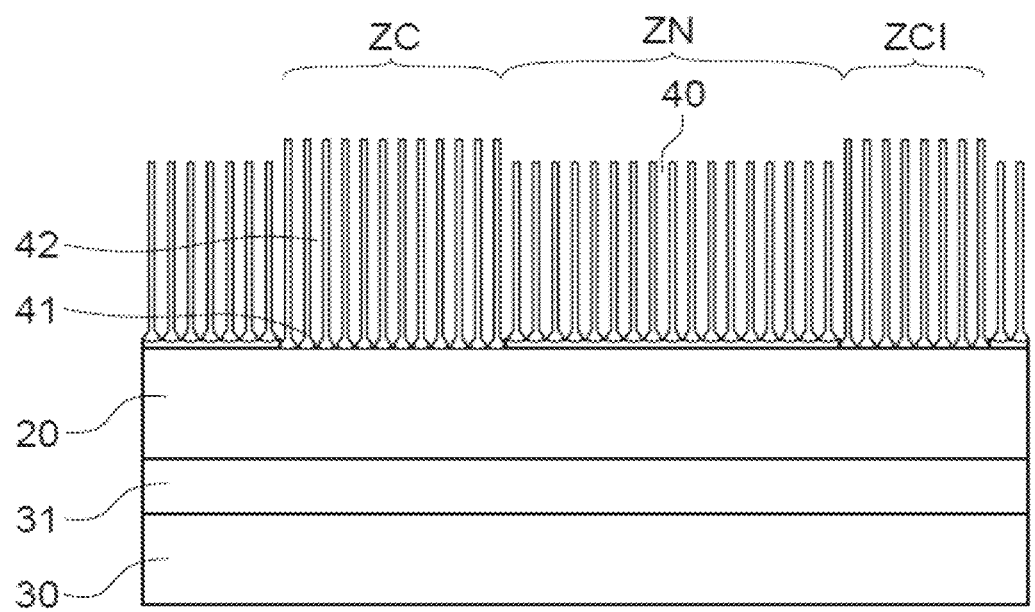
FIG. 8 is an illustration of a formation step of a network of nanotube bundles according to this invention.

Step c) is then followed by a step d) of growth of the nanotube bundles (FIG. 8). The nanotube bundles 40 are formed using standard techniques.

In particular, the carbon nanotube bundles can be formed by DC-PECVD or DCVD at a temperature of the order of 400° C. with different precursors and catalysts. In this regard, documents [4], [5], [6] and [7] cited at EP the end of the description, describe conditions for the growth of carbon nanotubes.

The average length L of the nanotube bundles can be between 2 μm and 40 μm, and advantageously between 2 μm and 12 μm.

Figure 9:
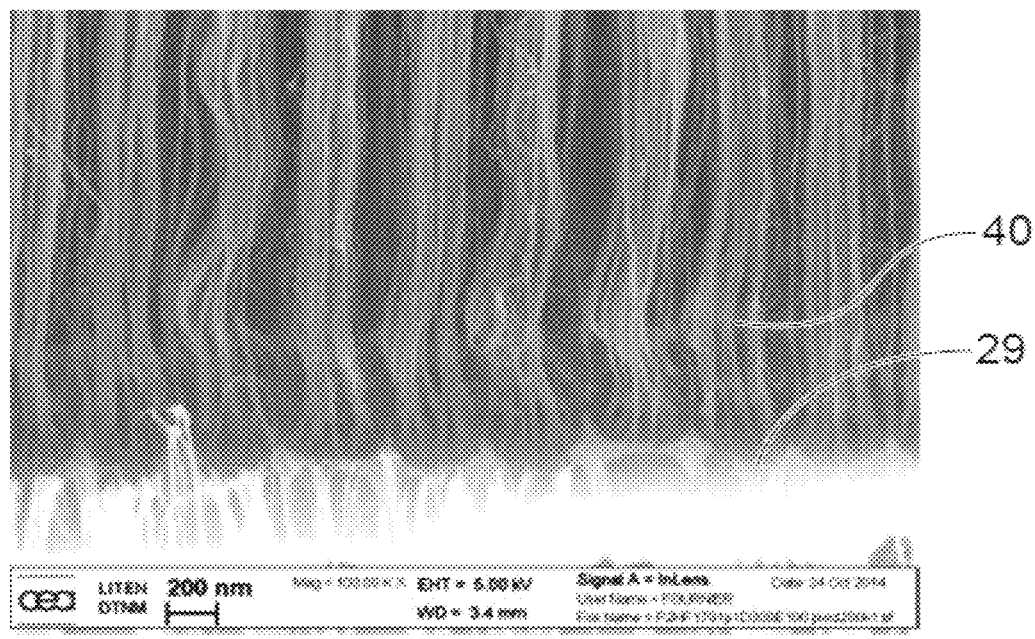
FIG. 9 is an image obtained using a scanning electron microscope that can be used to observe carbon nanotube bundles each initiating in a dish and extending substantially perpendicular to the layer of conducting material.

FIG. 9 is an observation of nanotube bundles obtained using the method according to this invention, using a scanning electron microscope. This image clearly shows the nanotube bundles 40 arranged in a network along a direction substantially perpendicular to the metallic layer 20, and that initiate in a concave cavity 29. Based on this observation, the inventors found that the concave cavities 29 help to orientate the formation of the nanotube bundles.

Thus according to this invention, the average depth P and the average lateral dimension D are adjusted such that each nanotube bundle 40 initiates in a concave cavity 29 and extends along a direction substantially perpendicular to the metallic layer 20.

Advantageously, step a) may be executed under conditions so as to obtain an average lateral dimension D equal to between 50 nm and 500 nm, advantageously between 50 nm and 300 nm, and particularly equal to 150 nm.

Still advantageously, step a) may be executed under conditions so as to obtain an average depth P equal to between 10 nm and 150 nm.

Step d) may be followed directly by a plasma treatment step d1) of the free ends of the nanotube bundles 40 so as to adjust their extension length.

The method according to this invention also comprises a step e) to encapsulate the network.

Figure 10:
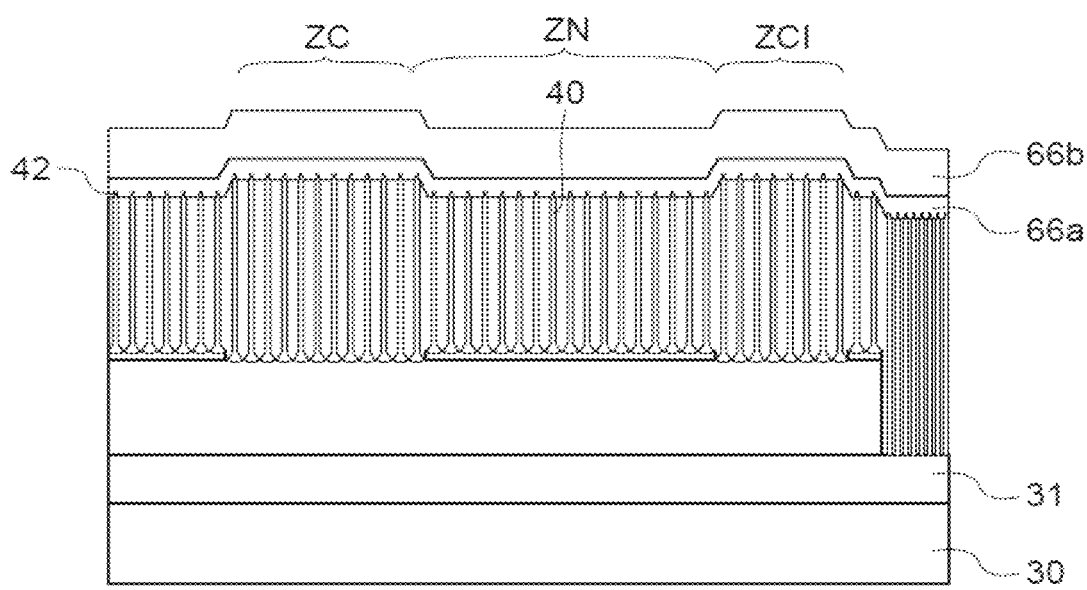
FIG. 10 is an illustration of an encapsulation step d) of the network of nanotube bundles according to this invention.

This encapsulation step illustrated on FIG. 10 comprises in particular the formation of a first dielectric layer 66a followed by the formation of a second dielectric layer 66b covering the network (and more particularly the free ends of the nanotube bundles).

The first dielectric layer 66a may comprise TEOS and its thickness may be between 100 and 1000 nm, for example equal to 500 nm.

Figure 11:
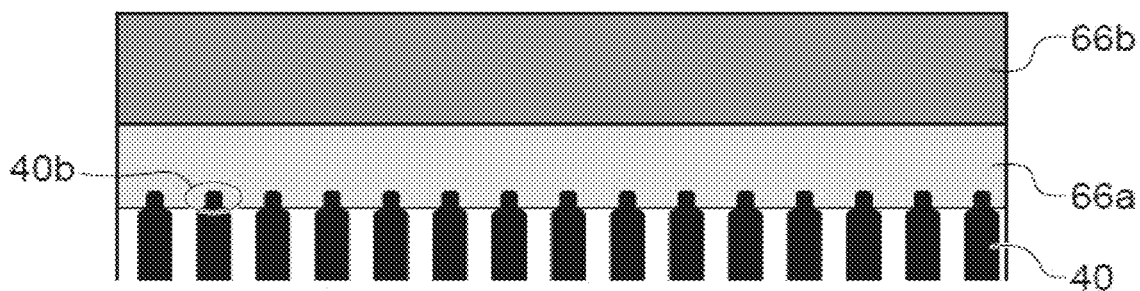
FIG. 11 is an illustration of the coating of the protected fraction of nanotube bundles by the first dielectric layer formed during step d)

The first dielectric layer 66a, during its deposition (although it is not conforming) coats a fraction, called the protected fraction 40b, of each of the nanotube bundles that extends from the free end 42 of said nanotube bundles 40 (FIG. 11). In particular, the first dielectric layer 66A may be formed so that the length of this fraction does not exceed 100 nm. Therefore it is understood that the length of this fraction is very much shorter than the total length of the nanotube bundles 40.

The particularly advantageous nature of this aspect will appear more clearly in the remainder of this description.

The second dielectric layer 66b, formed covering the first dielectric layer 66a, may comprise silicon nitride and its thickness may be between 100 nm and 500 nm.

Figure 12:
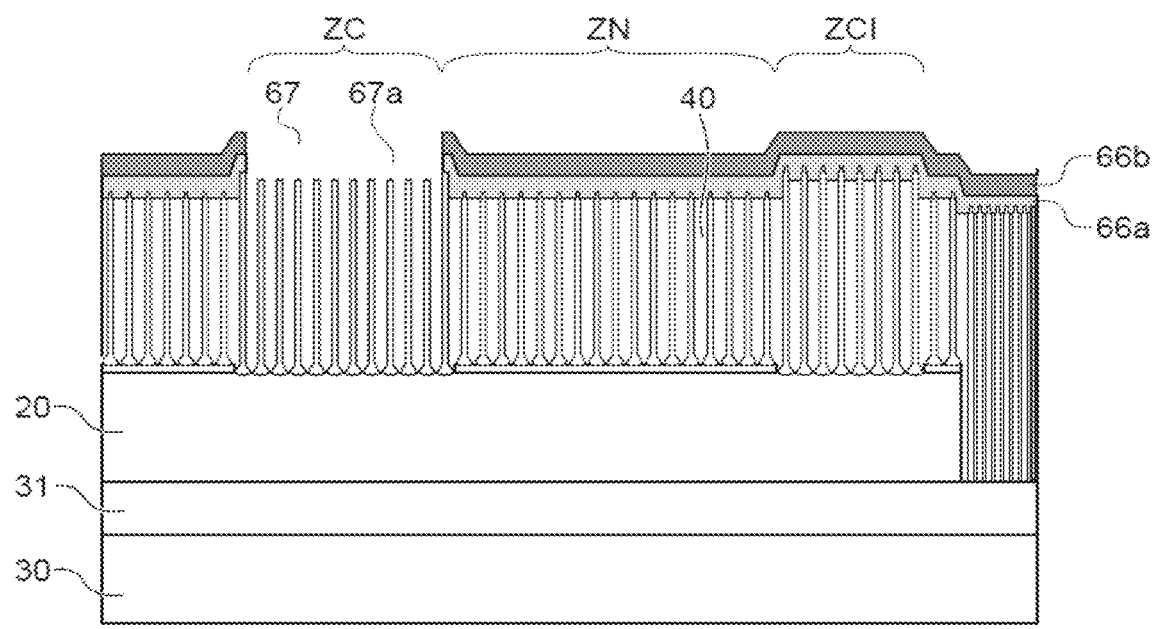
FIG. 12 is an illustration of an exposure step e) of the contact zone according to this invention to the external environment.

The method according to this invention comprises a step e) to expose the capacitive zone ZC to the external environment (FIG. 12).

In particular, this step e) comprises the definition of a first pattern 67 in the second dielectric layer 66b such that this layer forms a hard mask. It is understood that the first pattern 67 is simply a through opening formed in the second dielectric layer 66b. In particular, this first pattern 67 delimits the capacitive zone ZC.

The formation of this first pattern 67 can involve photolithography and etching steps, and a stripping step to remove the photosensitive resin.

Step e) also comprises an etching, particularly a dry etching, that will etch the first dielectric layer 66a through the hard mask formed by the second dielectric layer 66b, so as to form a first opening 67a conforming with the first pattern 67, and thus expose the capacitive zone ZC to the external environment.

Figure 13:
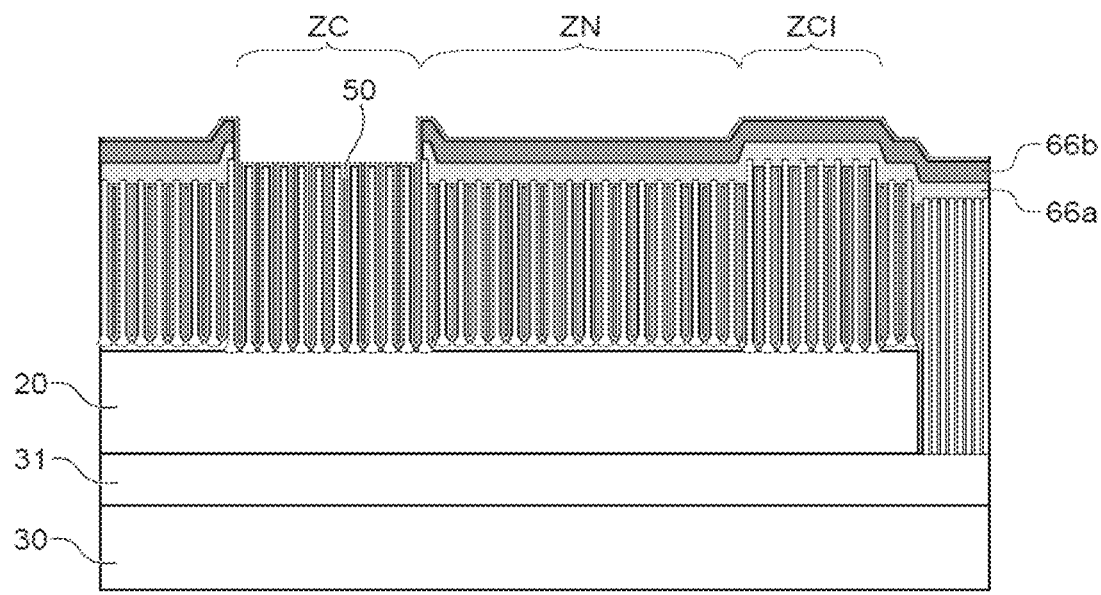
FIG. 13 is an illustration of a formation step f) of the capacitive stack according to this invention.

Step e) is then followed by a step f) to form the capacitive stack 50 using an atomic layer deposition technique (FIG. 13). This deposition technique, particularly conforming, deposits said stack between the spaces between the nanotube bundles, and more particularly in the neutral zone and the lower contact zone still masked by the first and the second dielectric layers.

Thus, step f) comprises, in order, the formation of the lower conducting layer 53 (however this layer may not be considered in the case of structures obtained with conducting materials), the insulating layer 52, and the upper conducting layer 51.

It is understood that after the conforming deposition step f), the capacitive stack covers the metallic layer between the nanotube bundles 40, but also these bundles from their base towards their free end.

Figure 15:
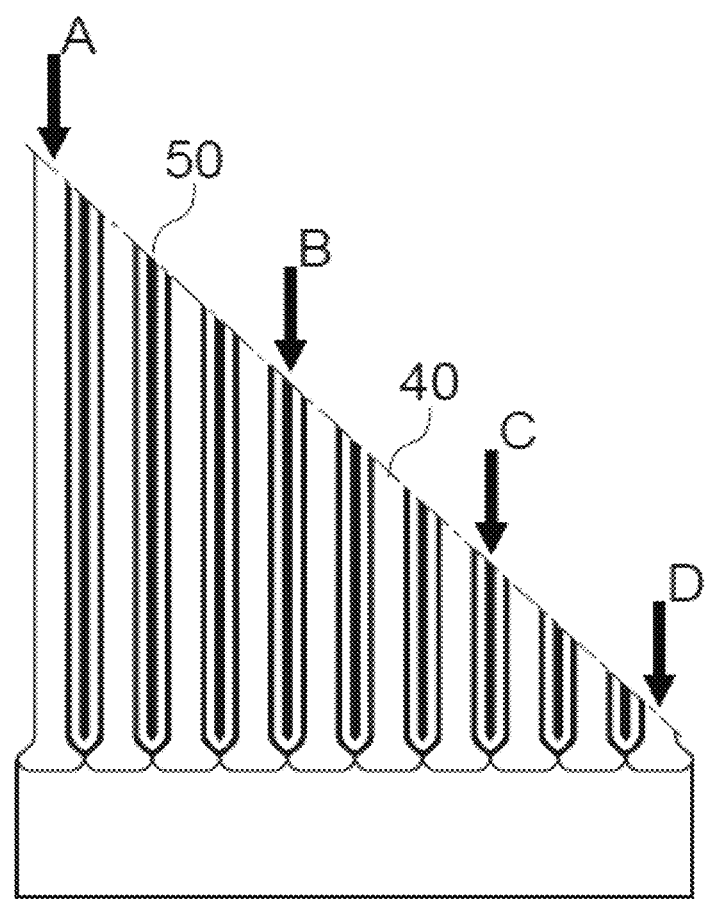
FIG. 15 is an illustration of a skew section of nanotube bundles after formation of the capacitive stack, the positions A, B, C and D illustrating different heights.
Figure 16A:
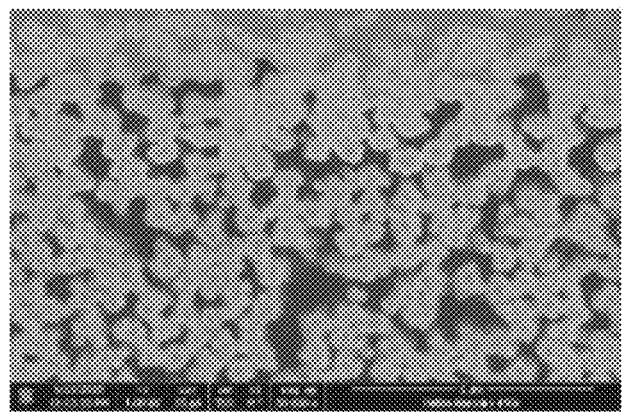
FIGS. 16A, 16B, 16C et 16D are images obtained by scanning electron microscopy at positions A, B, C, and D represented on FIG. 15.
Figure 16B:
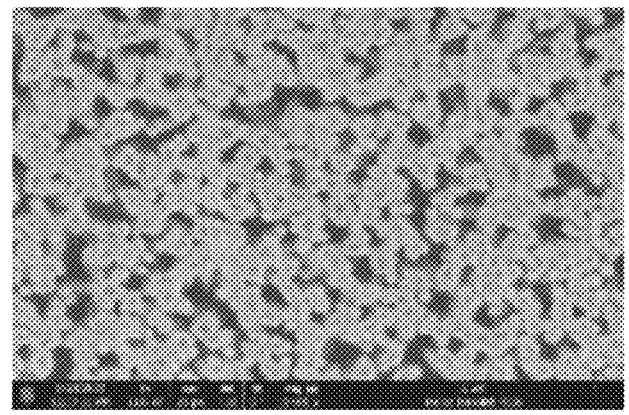
Figure 16C:
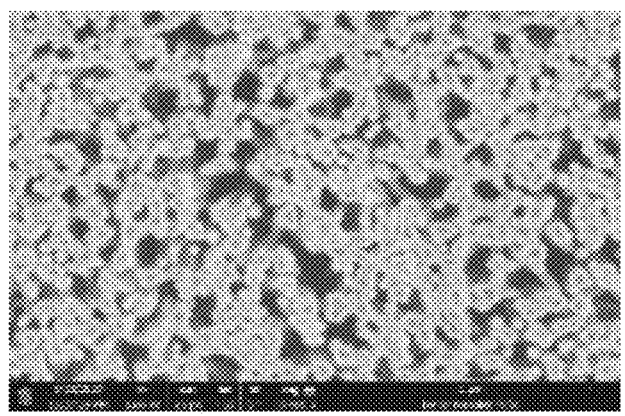
Figure 16D:
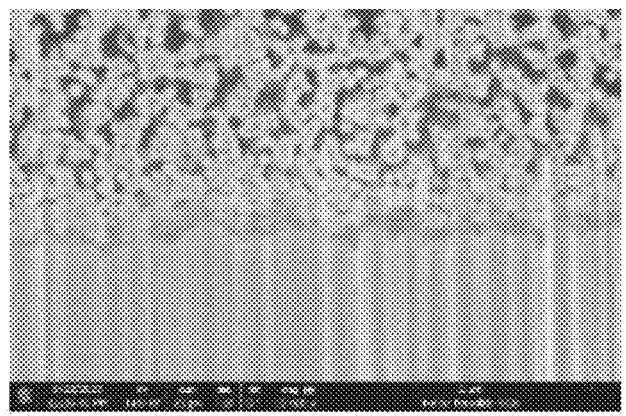
Figure 17:
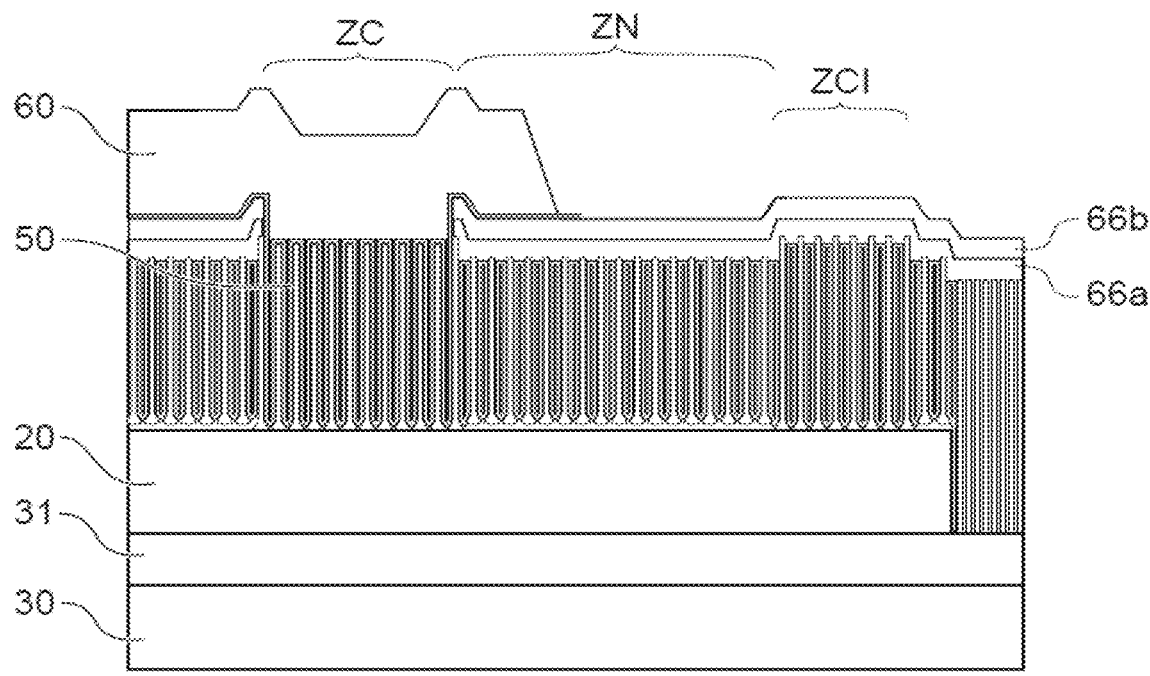
FIG. 17 is an illustration of the formation step g) of the upper electrode according to this invention.

In this respect, in order to validate the conforming nature of the capacitive stack on the nanotube bundles, the inventors have made observations with the scanning electron microscope on nanotube bundles at different positions A, B, C, and D illustrated on FIG. 15. Observations with the scanning electron microscope are given in FIGS. 16A, 16B, 16C and 16D. These figures confirm the possibility of forming the capacitive stack 50 on the nanotube bundles 40 in a conforming manner.

The second dielectric layer 66b, that is not protected during this deposition, is also covered by the capacitive stack 50.

It is also significant that at the lower contact zone ZCI and the neutral zone ZN, the protected fraction 40b of the nanotube bundles is not covered by the capacitive stack 50. More particularly, in both of these two zones, the insulating layer 52 and the lower conducting layer 53 (if it is considered) encapsulate the upper conducting layer 51.

Figure 14:
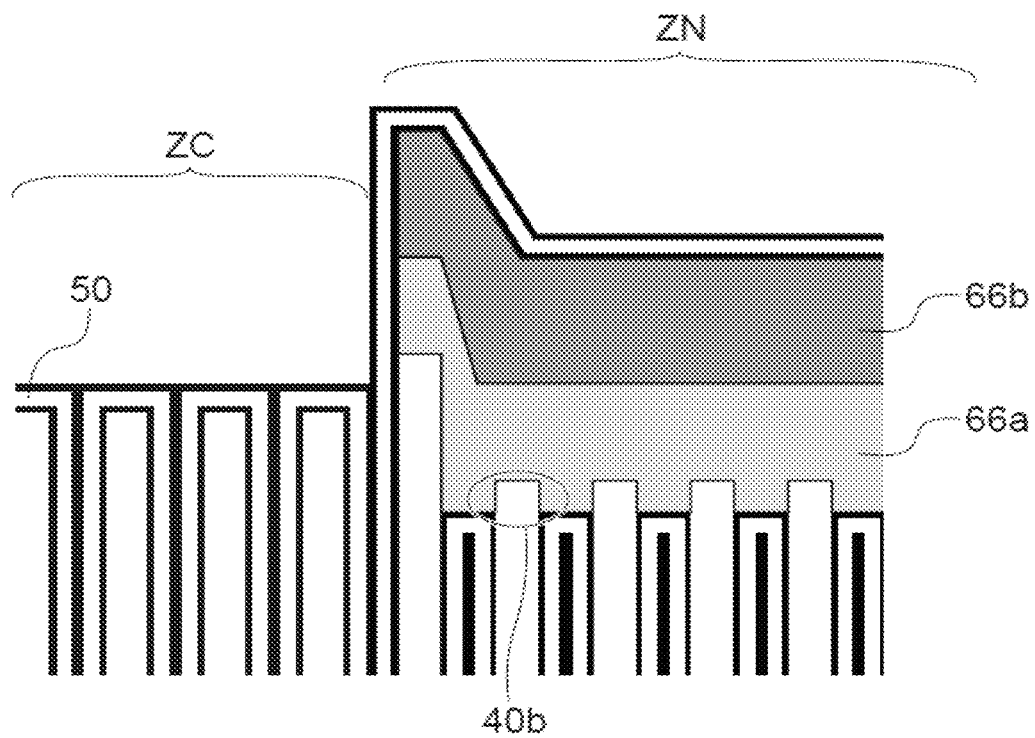
FIG. 14 is an illustration of the arrangement of the capacitive stack at the free ends of the nanotube bundles in the capacitive zone and in the neutral zone.

FIG. 14 thus illustrates the arrangement of the capacitive stack 50 formed by the upper conducting layer 51, the insulating layer 52 and the lower conducting layer 53. Thus, as represented on this FIG. 14, in the capacitive zone ZC, the capacitive stack 50 entirely coats the nanotube bundles (particularly the free ends). On the other hand, in the neutral zone ZN (the effect is identical in the lower contact zone ZCI), the protected fraction is not covered by the capacitive stack 50. More particularly, in this zone the upper conducting layer 51 is completely encapsulated by the insulating layer 52 and the lower conducting layer 51.

This arrangement as described below makes it possible to make electrical contacts in the upper conducting layer 51, and the lower conducting layer 53 respectively, without exposing the nanotube bundle 40 to steps in the method that could damage them.

Thus, the method according to this invention includes the formation of an upper electrode 60 during a step g), covering the capacitive zone ZC. The upper electrode 60 may slightly cover the layers 66a and 66b in the neutral zone ZN. Formation of the upper electrode 60 is known to an expert in the subject, and therefore is not described in further detail. Step g) may also include stripping of the capacitive stack covering the second dielectric layer 66b after formation of the upper electrode 60. However, it is understood that the section of the capacitive stack covered by the upper electrode 60 is kept.

Figure 18:
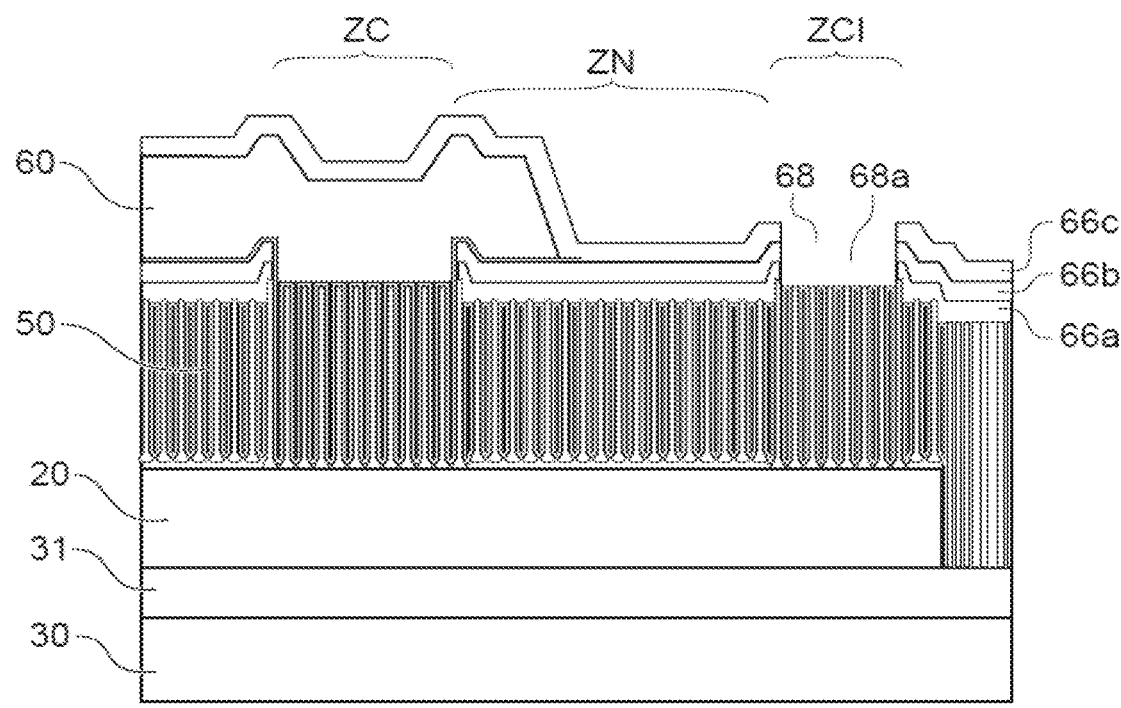
FIG. 18 is an illustration of an exposure step h) of the lower contact zone according to this invention to the external environment.

FIG. 18 shows an illustration of a step h) intended to expose the lower contact zone ZCI to the external environment.

This step h) comprises the following steps in particular:

h1) formation of a third dielectric layer 66c covering the upper electrode and the second dielectric layer 66b;

h2) definition of a second pattern 68 in the second dielectric layer 66b and the third dielectric layer such that the latter form a hard mask. It is understood that the second pattern 68 is simply a through opening formed in the second dielectric layer 66b and the third dielectric layer. In particular, this second pattern 68 defines the lower contact zone ZCI.

The formation of this second pattern 68 can involve photolithography and etching steps, and a stripping step to remove the photosensitive resin.

Step h) also comprises an etching sub-step h3), particularly a dry etching, that will etch the first dielectric layer 66a through the hard mask formed by the second dielectric layer 66b and the third dielectric layer, so as to form a second opening 68a conform with the second pattern 68, and thus expose the lower contact zone ZCI to the external environment.

Figure 19:
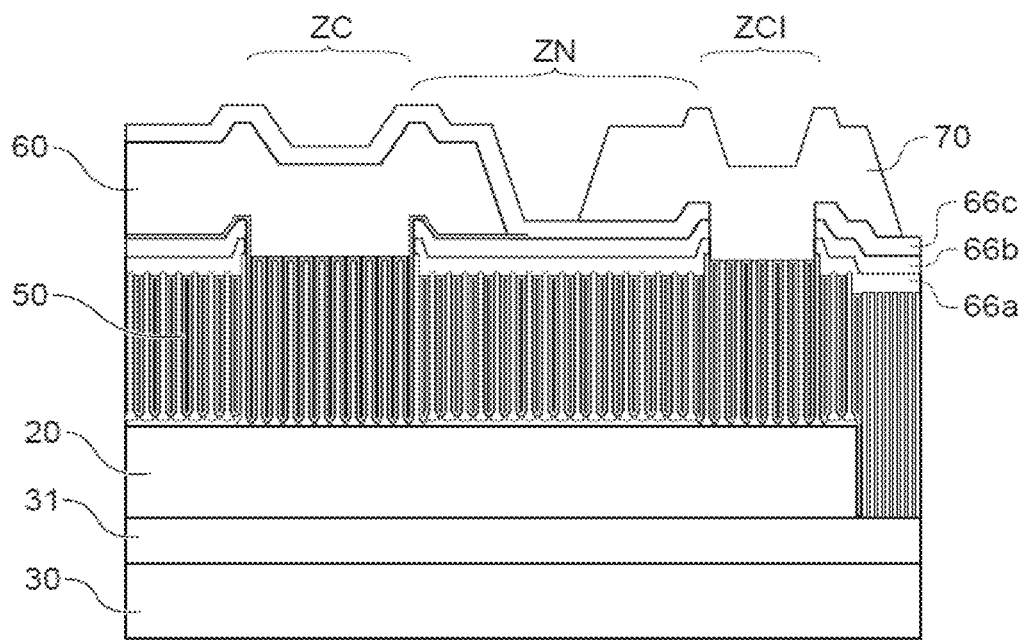
FIG. 19 is an illustration of the formation step of the lower electrode according to this invention.
Figure 20:
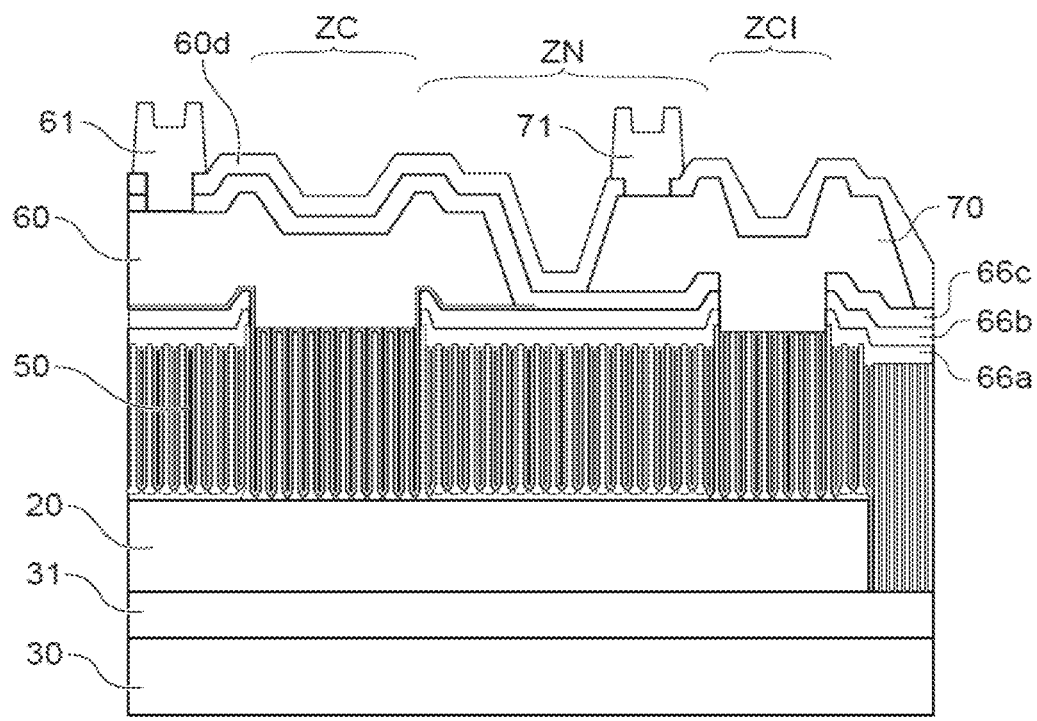
FIG. 20 is an illustration of making contact at the upper electrode and the lower electrode according to this invention.

Step h) is then followed by the formation of a lower electrode 70 following a protocol similar to that used for the formation of the upper electrode 60 (FIG. 19).

Finally, the method of manufacturing the capacitive device terminates by the formation of a passivation layer 66d, and opening of this passivation layer at two contact points so as to provide electrical access to the upper electrode 60 and to the lower electrode 70.

In particular, the contact points are metallic studs 61 and 71 ("Upper Bump Metallurgy" (UBM).

REFERENCES

[1] A. M. Saleem et al., "*Fully solid-state integrated capacitors based on carbon nanofibers and dielectrics with* specific capacitances higher than 200 nF/mm², IEEE 69th electronic Components and Technology conference, pages 1870-1876, 2019;

[2] A. M. Saleem et al., "*Low temperature and cost-effective growth of vertically aligned carbon nanofibers using spin-coated polymer-stabilized palladium nanocatalyst*", Sci. Technol. Adv. Mater., vol. 16, No. 1, page 015007, 2015;

[3] Kikuchi Tatsuya et al., "*Porous Aluminium Oxide formed by Anodizing in Various Electrolyte Species*", Current Nanoscience, 11(5), 560-571, 2015;

[4] J. Dijon et al., "*How to switch from a tip to base growth mechanism in carbon nanotube growth by catalytic chemical vapour deposition*", Carbon, Vol. 48, Issue 13, pages 3953-3963, 2010;

[5] S. Liatard et al., "*Vertically-aligned carbon nanotubes on aluminum as a light-weight positive electrode for lithium-polysulfide batteries*", Chem. Commun., 51, 7749, 2015;

[6] U.S. Ser. No. 10/370,759;

[7] R. Ramos et al., «*Nanocarbon interconnects combining vertical CNT interconnects and horizontal graphene lines*», IEEE International Interconnect technology conference/Advanced Metallization Conference, 23-26 May 2016.

The invention claimed is:

1. A capacitive device, comprising:
a metallic layer provided with two principal faces, the two principal faces being a front face and a back face respectively;
a network of nanowires or nanotube bundles that extend from the front face, and substantially perpendicular to the front face, from a base towards a free end;
a continuous capacitive stack covering the metallic layer and the network of nanowires or nanotube bundles in a conforming manner from the base to the free end, the continuous capacitive stack comprising an upper conducting layer and an insulating layer insulating the upper conducting layer from the network of nanowires or nanotube bundles and from the metallic layer; and
a capacitive zone and a lower contact zone,
the capacitive zone being a zone in which the upper conducting layer encapsulates the network of nanowires or nanotube bundles and the insulating layer, and the lower contact zone being a zone in which the continuous capacitive stack leaves the free end exposed, and the insulating layer encapsulates the upper conducting layer.

2. The capacitive device according to claim 1, further comprising an upper electrode covering the capacitive zone so as to electrically contact the upper conducting layer.

3. The capacitive device according to claim 1, further comprising a lower electrode covering the lower contact zone so as to electrically contact the free end of the network of nanowires or nanotube bundles in the lower contact zone.

4. The capacitive device according to claim 1, wherein the continuous capacitive stack further comprises a lower conducting layer intercalated between the insulating layer and the network of nanowires or nanotube bundles, the lower conducting layer encapsulating the insulating layer in the lower contact zone.

5. The capacitive device according to claim 3, wherein the continuous capacitive stack further comprises a lower conducting layer intercalated between the insulating layer and the network of nanowires or nanotube bundles, the lower conducting layer encapsulating the insulating layer in the lower contact zone, and
wherein the lower electrode is also in electrical contact with the lower conducting layer.

6. The capacitive device according to claim 4, wherein the lower conducting layer comprises titanium nitride.

7. The capacitive device according to claim 1, wherein the upper conducting layer comprises titanium nitride.

8. The capacitive device according to claim 1, wherein the insulating layer comprises alumina.

9. The capacitive device according to claim 1, further comprising a neutral zone interposed between the capacitive zone and the lower contact zone,
wherein a lower insulating layer is intercalated between the metallic layer and the network of nanowires or nanotube bundles in the neutral zone.

10. The capacitive device according to claim 9, wherein the neutral zone is covered by at least one encapsulation layer made of an insulating material.

11. The capacitive device according to claim 10, wherein the at least one encapsulation layer comprises a silicon oxide layer and a silicon nitride layer.

12. The capacitive device according to claim 1, wherein a length of the network of nanowires or nanotube bundles is between 2 µm and 40 µm.

13. The capacitive device according to claim 1, wherein a length of the network of nanowires or nanotube bundles is between 2 µm and 12 µm.

14. The capacitive device according to claim 1, wherein the metallic layer is an aluminium layer with a thickness of between 0.5 µm and 3 µm, textured on a front face thereof, the texture being materialized by a network of concave cavities with an average depth P and an average lateral dimension D, starting from which the network of nanowires or nanotube bundles extends.

15. The capacitive device according to claim 14, wherein the average lateral dimension D is between 50 nm and 500 nm.

16. The capacitive device according to claim 14, wherein the average depth P is between 10 nm and 150 nm.

17. The capacitive device according to claim 1, wherein nanotube bundles of the network of nanowires or nanotube bundles are carbon nanotube bundles.

18. The capacitive device according to claim 1, wherein the metallic layer is supported through a face thereof that is opposite the front face, on a support substrate.

19. The capacitive device according to claim 18, wherein a dielectric layer is intercalated between the support substrate and the metallic layer.

20. A method of manufacturing the capacitive device according to claim 1, the method comprising the following steps:
a) an anodisation step of a metallic layer with a first thickness, starting from a front face of the metallic layer and over a second thickness less than the first thickness, and that will form an oxide layer;
b) an etching step of the oxide layer formed in step a);
c) a step of growth of a network of nanowires or nanotube bundles,
step a) being executed such that an exposed face of the metallic layer after step b) is textured, the texture being materialized by a network of concave cavities with average depth P and average lateral dimension D, the average depth P and the average lateral dimension D being adjusted such that the network of nanowires or nanotube bundles initiates in a concave cavity and extends from the concave cavity from a base towards a free end substantially perpendicular to the metallic layer;

d) a definition step of a capacitive zone that comprises forming a stack of a first dielectric layer and a second dielectric layer covering the network of nanowires or nanotube bundles, and forming a first through-opening in the stack, the first through-opening opening delimiting a contact zone;

e) a formation step of a continuous capacitive stack covering the metallic layer and the network of nanowires or nanotube bundles from the base to the free end in a conforming manner, the continuous capacitive stack comprising an upper conducting layer and an insulating layer insulating the upper conducting layer from the network of nanowires or nanotube bundles and the metallic layer, the upper conducting layer encapsulating the network of nanowires or nanotube bundles and the insulating layer in the capacitive zone, whereas in a lower contact zone different from the capacitive zone the continuous capacitive stack leaves the free end exposed, and the insulating layer encapsulates the upper conducting layer; and f) forming the upper electrode in the capacitive zone; and g) forming a lower electrode in the lower contact zone.

* * * * *